US012796480B2

(12) United States Patent
Kim et al.

(10) Patent No.: US 12,796,480 B2
(45) Date of Patent: Nov. 10, 2026

(54) WAFER BEFORE SEMICONDUCTOR PROCESS AND SEMICONDUCTOR CHIP MANUFACTURING METHOD USING THE SAME

(71) Applicant: Samsung Electronics Co., Ltd., Suwon-si (KR)

(72) Inventors: Jeongdu Kim, Suwon-si (KR); Sunghyup Kim, Suwon-si (KR); Woongkee Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 273 days.

(21) Appl. No.: 18/426,730

(22) Filed: Jan. 30, 2024

(65) Prior Publication Data

US 2025/0046727 A1 Feb. 6, 2025

(30) Foreign Application Priority Data

Aug. 2, 2023 (KR) ........................ 10-2023-0101181

(51) Int. Cl.
*H10W 46/00* (2026.01)
*H10P 14/692* (2026.01)

(52) U.S. Cl.
CPC ....... *H10W 46/00* (2026.01); *H10P 14/69215* (2026.01); *H10W 46/503* (2026.01)

(58) Field of Classification Search
CPC . H10W 46/00; H10W 46/503; H10W 42/121; H10P 14/69215; H10P 90/12; H10P 54/00; H10P 95/00; H10P 14/66; H10P 72/7402
See application file for complete search history.

(56) References Cited

U.S. PATENT DOCUMENTS

| | | | | |
|---|---|---|---|---|
| 8,299,580 | B2 * | 10/2012 | Kumakawa | B23K 26/40 257/737 |
| 10,593,631 | B2 | 3/2020 | Ranaweera | |
| 11,450,770 | B2 | 9/2022 | Sun et al. | |
| 2006/0163689 | A1 * | 7/2006 | Seo | H10W 42/121 438/448 |
| 2006/0240644 | A1 | 10/2006 | Le Vaillant | |
| 2007/0158839 | A1 | 7/2007 | Trezza | |
| 2007/0267724 | A1 | 11/2007 | Jeng et al. | |
| 2008/0217717 | A1 | 9/2008 | Pfister et al. | |
| 2016/0035682 | A1 | 2/2016 | Chen et al. | |
| 2022/0059472 | A1 * | 2/2022 | Lee | H10P 54/00 |
| 2022/0102289 | A1 * | 3/2022 | Kim | H10P 14/60 |
| 2022/0130772 | A1 | 4/2022 | Furuta et al. | |

FOREIGN PATENT DOCUMENTS

| | | | |
|---|---|---|---|
| KR | 10-2006-0113983 | A | 11/2006 |
| KR | 10-2009-0035124 | A | 4/2009 |
| KR | 10-2012-0004813 | A | 1/2012 |
| KR | 10-2015-0000847 | A | 1/2015 |

* cited by examiner

*Primary Examiner* — Mark W Tornow
(74) *Attorney, Agent, or Firm* — HARNESS, DICKEY & PIERCE, P.L.C.

(57) ABSTRACT

A wafer includes: a scribe lane surrounding a semiconductor chip region on one surface of the wafer body; and a stress adjustment portion in the scribe lane and including a first film and a second film that have at least different materials from that of the wafer body. The wafer may be provided before a semiconductor process.

20 Claims, 11 Drawing Sheets

WAFER BEFORE SEMICONDUCTOR PROCESS AND SEMICONDUCTOR CHIP MANUFACTURING METHOD USING THE SAME

CROSS-REFERENCE TO RELATED APPLICATION(S)

This application claims benefit of priority to Korean Patent Application No. 10-2023-0101181 filed on Aug. 2, 2023 in the Korean Intellectual Property Office, the disclosure of which is incorporated herein by reference in its entirety.

BACKGROUND

Example embodiments relate to a wafer before a semiconductor process and/or a semiconductor chip manufacturing method using the same.

Recently, a wafer warpage phenomenon has increased due to an increase in the size of (e.g., diameter of) semiconductor wafers and/or an advancement of processes. The increase in wafer warpage in the semiconductor processes may result in a process risk of final semiconductor chips, e.g., chips that do not yield.

Since a semiconductor wafer is a single crystal of Si, the wafer does not have stress by itself, but tensile stress and/or compressive stress occurring in thin films stacked during a process may be accumulated, which may cause wafer warpage.

In order to solve or at least partly address this problem, a thin film of a different material is stacked on a rear surface of a wafer to relieve tensile stress and/or compressive stress occurring in a semiconductor process, such as deposition or etching.

This method of alleviating warpage is able to cope with warpage up to 150 μm, but the method was insufficient to deal with warpage with high stress of 300 to 400 μm. When the thickness of the thin film stacked on the rear surface of the wafer exceeded a certain level, a wafer cracking phenomenon also occurred.

A method of alleviating warpage by forming a scribe lane on a wafer has also been proposed, but this method also has a problem in that the method may be difficult to actively respond to warpage.

SUMMARY

Various example embodiments may provide a wafer before a semiconductor process having a scribe lane in which a different material is buried to help reduce warpage occurring in a semiconductor process is formed.

Alternatively or additionally, various example embodiments may provide a method of manufacturing a semiconductor chip, capable of reducing warpage of the wafer before a semiconductor process by increasing tensile stress in response to positive warpage of a wafer occurring during the semiconductor process.

Alternatively or additionally, various example embodiments may provide a method of manufacturing a semiconductor chip, capable of reducing warpage of the wafer before a semiconductor process by increasing compressive stress in response to negative warpage of a wafer occurring during the semiconductor process.

According to various example embodiments, a wafer includes: a scribe lane surrounding a semiconductor chip region on one surface of the wafer body; and a stress adjustment portion in the scribing lane and including a first film and a second film that have at least different materials from that of the wafer body.

According to various example embodiments, a wafer includes: a wafer body, the wafer body having a notch disposed at one end thereof, wherein the wafer having a horizontal direction and a vertical direction based on the notch; a scribe lane recessed to surround a semiconductor chip region in the horizontal direction and the vertical direction on one surface of the wafer body; and a stress adjustment portion in the scribe lane and including a first film and a second film that have at least different materials from that of the wafer body.

Alternatively or additionally according to various example embodiments, a semiconductor chip manufacturing process includes: preparing a wafer before a semiconductor process, the wafer including at least a first film and a second film of at least different materials that are in a scribe lane that surrounds a semiconductor chip region; inserting the wafer into a semiconductor process chamber before the semiconductor process and starting the semiconductor process in the process chamber; in response to positive warpage occurring in the wafer during the semiconductor process, etching the first film to generate tensile stress, the generating tensile stress at least partially alleviating the positive warpage; and completing the semiconductor process.

Alternatively or additionally according to various example embodiments, a semiconductor chip manufacturing process includes: preparing a wafer before a semiconductor process, the wafer including at least a first film and a second film of at least different materials in a scribe lane that surrounds a semiconductor chip region; inserting the wafer into a semiconductor process chamber before the semiconductor process and starting the semiconductor process in the process chamber; in response to negative warpage occurring in the wafer during the semiconductor process, etching the second film to generate compressive stress, the generating compressive stress at least partly alleviating to alleviate the negative warpage; and completing the semiconductor process.

BRIEF DESCRIPTION OF DRAWINGS

The above and other aspects, features, and advantages of various example embodiments will be more clearly understood from the following detailed description, taken in conjunction with the accompanying drawings, in which.

DETAILED DESCRIPTION

Figure 1:
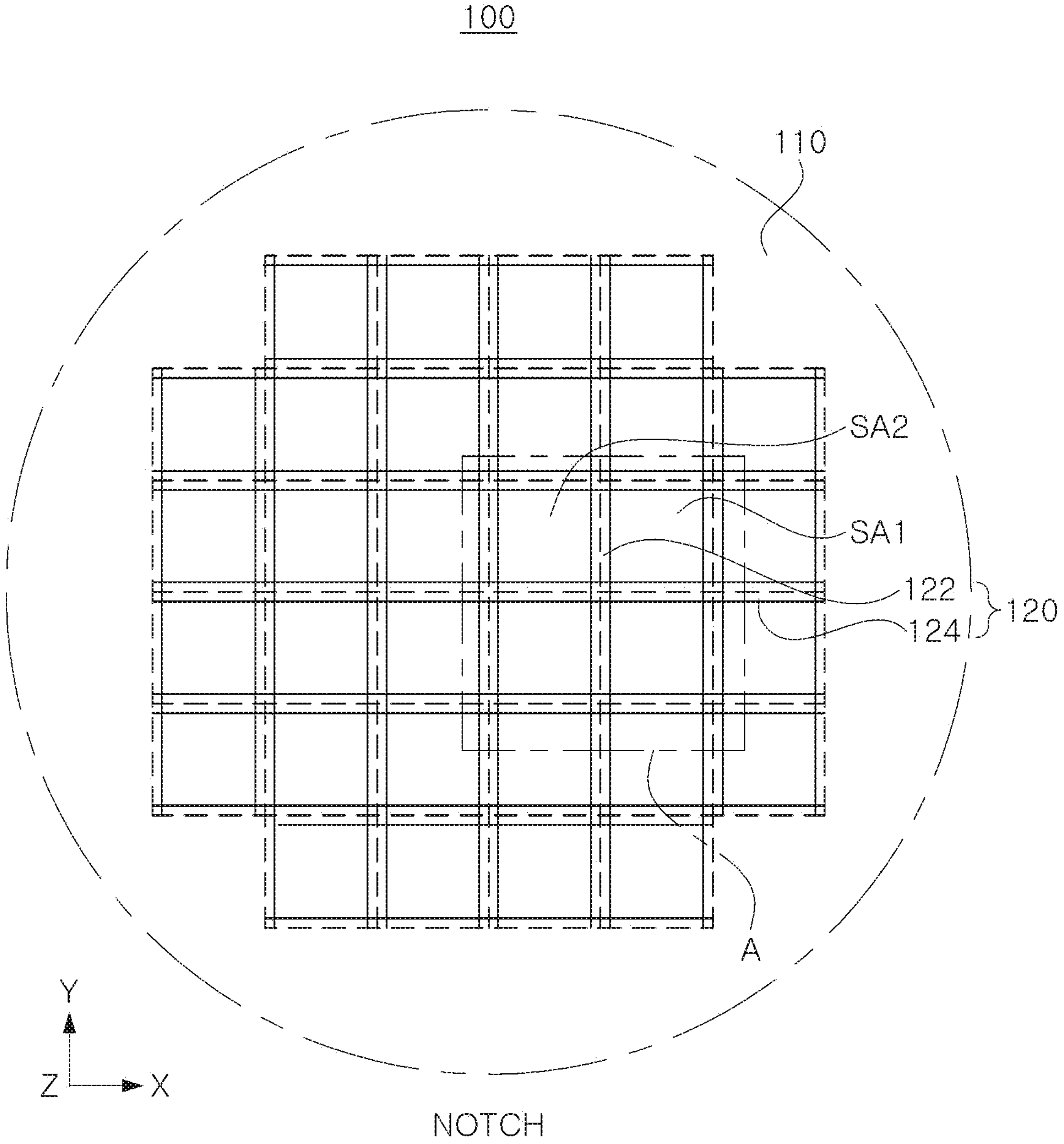
FIG. 1 is a schematic plan view of a wafer before a semiconductor process according to some example embodiments.

Hereinafter, various example embodiments will be described with reference to the accompanying drawings.

Example embodiments may be modified into other forms and are provided so that this disclosure will be thorough and complete and will fully convey the scope of the invention to those of ordinary skill in the art. In the drawings, the shapes and/or dimensions of elements may be exaggerated for clarity, and like reference numerals denote like elements.

In various example embodiments, the meaning of a "connection" of a component to another component includes an indirect connection through another element as well as a direct connection between two components. In addition, in some cases, the meaning of "connection" includes all "electrical connections".

It may be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The terms used in various example embodiments are used to simply describe an example and are not intended to limit the present inventive concept. A singular term includes a plural form unless otherwise indicated or clear from context.

Wafer Before Semiconductor Process

Figure 2:
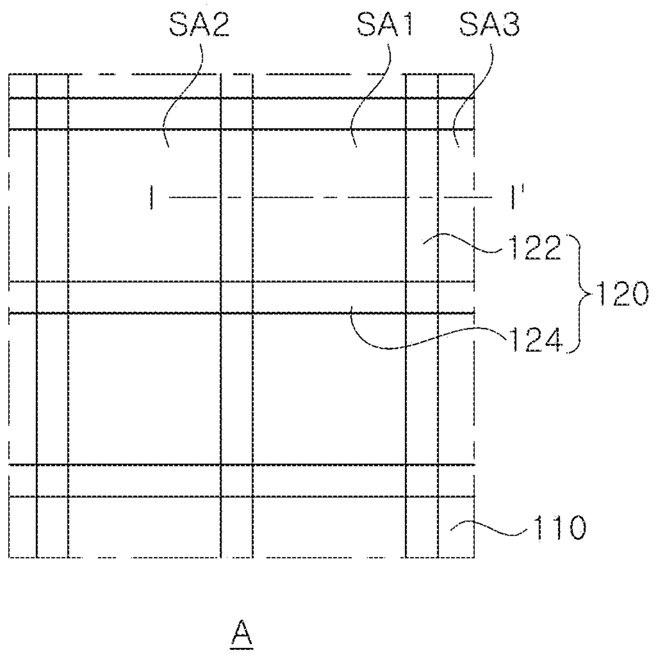
FIG. 2 is an enlarged view of portion A of FIG. 1.

FIG. 1 is a schematic plan view of a wafer before a semiconductor process according to various example embodiments, and FIG. 2 is an enlarged view of portion A of FIG. 1. Also, FIG. 3 is a cross-sectional view taken along line I-I' in FIG. 2.

Figure 3:
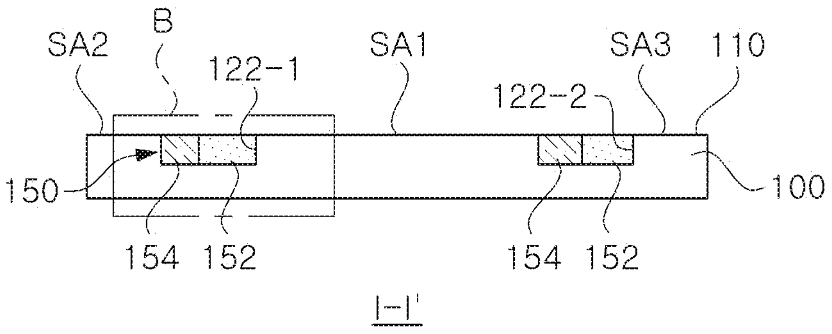
FIG. 3 is a cross-sectional view taken along line I-I' in FIG. 2.

Referring to FIGS. 1 to 3, a wafer 100 before a semiconductor process according to various example embodiments includes a wafer body 110, a scribe lane 120, and a stress adjustment portion 125.

The wafer 100 before a semiconductor process is a wafer body before starting the semiconductor process, and the wafer 100 before a semiconductor process of the present inventive concept is a thin crystalline silicon sheet grown from polycrystalline molten silicon in a specific direction. The wafer 100 before a semiconductor process may refer to a wafer before a semiconductor process is performed and after being transferred to a semiconductor process chamber. The size, e.g., the diameter, of the wafer 100 is 50 to 300 mm or 450 mm, the thickness thereof is generally 0.5 to 1 mm, and the wafer 100 may be manufactured to be thinner in some example embodiments. The wafer 100 may include a flat (not shown) on an edge thereof; example embodiments are not limited thereto.

When a semiconductor process is performed, thermal deformation of the wafer may occur, resulting in a bow phenomenon in which the middle of the wafer is bent convexly or concavely, resulting in poor flatness of the wafer. The flatness of the wafer is managed by reducing the occurrence of warpage. Warpage may be expressed as Warp=|RPDmax|−|RPDmin|, a difference between an absolute value of the maximum and an absolute value of the minimum values between a reference plane and a median plane of the wafer.

Here, RPDmax is a distance of the maximum convex deformation point from a central plane of the wafer, and RPDmin is a distance of the maximum concave deformation point from the central plane of the wafer.

For example, a positive (+) value of Warp is known as +warpage, and a negative (−) value of Warp known as −warpage.

Since the flatness of a wafer is related, e.g., is directly related to quality of a semiconductor chip and/or process yield after a semiconductor process, it may be important or desirable or essential to manage the flatness of the wafer, to prevent or reduce the likelihood of and/or the impact from warpage occurring as the wafer becomes larger and/or thinner.

In order to prevent or reduce warpage from occurring during a semiconductor process, the scribe lane 120 is formed on an upper surface 110 of the wafer body 100 before the semiconductor process. The upper surface 110 may be the front side surface upon which various semiconductor chips will be fabricated. The scribe lanes 120 are arranged to surround semiconductor chip forming regions SA1, SA2, SA3, . . . in which semiconductor chips are formed during the semiconductor process. The number of semiconductor chip forming regions SA1, SA2, SA3 . . . are not limited to those disclosed in the figures, and may be greater than, or less than, the number illustrated in FIG. 1. The semiconductor chip forming regions SAL, SA2, SA3, . . . are subjected to processes, such as exposure, deposition, and etching in the semiconductor process and then are diced along the scribe lanes 120 to become semiconductor chips (devices).

The wafer body 100 may have a notch formed at one end to distinguish between upper and lower positions in the semiconductor process, and directions may be defined in a horizontal direction (an X-direction) and a vertical direction (a Y-direction) based on the notch.

The scribe lane 120 is recessed to surround the semiconductor chip forming regions SA1, SA2, SA3, . . . in the horizontal direction (X-direction) and the vertical direction (Y-direction). The scribe lane 120 includes a scribe lane 122 in the vertical direction and a scribe lane 124 in the horizontal direction.

The stress adjustment portion 150 is provided in the scribing lane 120 to suppress or at least partly suppress or mitigate warpage occurring due to thermal deformation during the semiconductor process. The stress adjustment portion 150 is or includes a laminated thin film formed of a material different from that of the wafer body. When +warpage occurs in the wafer body 100 during the semiconductor process, the stress adjustment portion 150 may generate tensile stress to flatten or at least partly flatten the wafer body 100, and when −warpage occurs in the wafer body 100 during the semiconductor process, the stress adjustment portion 150 may generate compressive stress to flatten or at least partly flatten the wafer body 100.

Referring to FIG. 3, two vertical scribe lanes 122-1 and 122-2 are illustrated on the upper surface 110 of the wafer body 100, and the semiconductor chip forming regions SA1, SA2, SA3, . . . are arranged based on the scribe lanes 122-1 and 122-2. The stress adjustment portion 150 is stacked on the scribe lanes 122-1 and 122-2 and exposed to the upper surface 100 of the wafer body 100. The stress adjustment portion 150 includes at least a first film 152 and a second film 154 that are formed of materials different from that of the wafer body 100, and that may be formed of different materials from each other. For example, the wafer body 100 may be formed of single-crystal silicon such as doped or undoped single-crystal silicon, one of the first film 152 or 154 may be formed of polysilicon such as doped or undoped polysilicon, and the other of the first film 152 or 154 may be formed of silica (SiO2) in an amorphous phase.

The first film 152 may generate compressive stress due to the coefficient of thermal expansion thereof being higher than that of the wafer body 100. In some example embodiments, the first film 152 may include polysilicon such as doped or undoped silicon, and may not include silica and/or single-crystal silicon.

The second film 154 may generate tensile stress due to the coefficient of thermal expansion lower than that of the wafer body 100. In some example embodiments, the second film 154 may include silica ($SiO_2$). In some example embodiments, the second film 154 may not include single-crystal or polycrystalline silicon.

After deposition of and/or growth of silica ($SiO_2$), the coefficient of thermal expansion at room temperature is 0.5 ppm, the coefficient of thermal expansion of the wafer body 100 formed of Si is 2.6 ppm, and the coefficient of thermal expansion at room temperature after deposition of polysilicon is 3.0 ppm. Thus, silica may cause tensile stress when deposited in and/or grown in the scribe lane 122, and polysilicon causes compressive stress when deposited in the scribe lane 122.

Tensile stress and compressive stress of the first film 152 and the second film 154 may be balanced or at least partially balanced in the wafer 100 before the process, but when the volume is reduced by etching in the semiconductor process, tensile stress or compressive stress may occur.

Although example embodiments describe two materials are included, other materials may be added or may be repeatedly arranged in the scribe lane 122.

Figure 4:
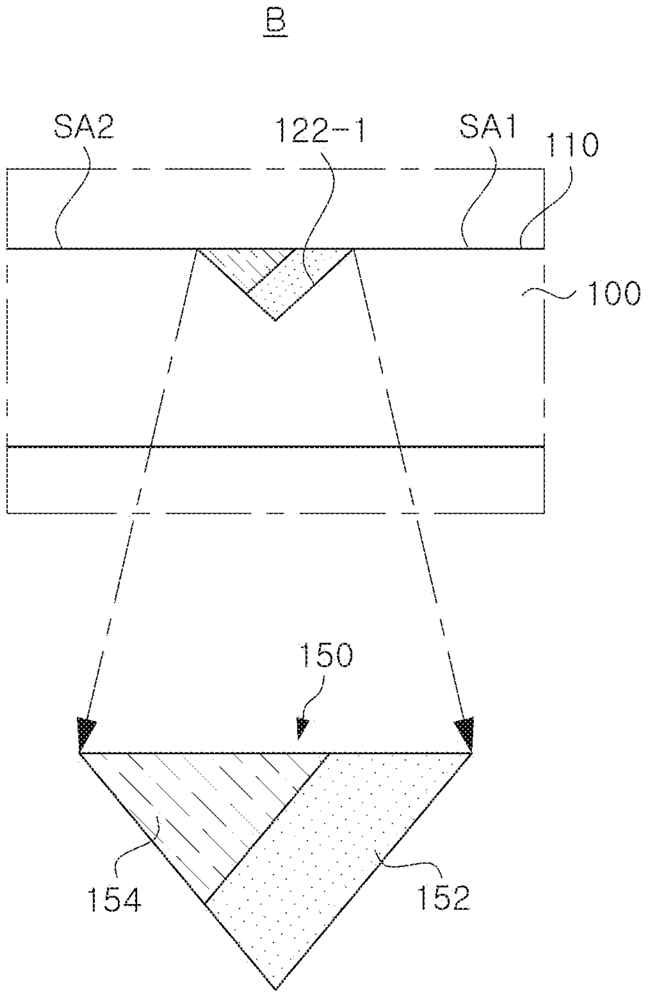
FIG. 4 is an enlarged view of portion B in FIG. 3 and is a schematic diagram illustrating a scribe lane of some example embodiments.
Figure 5:
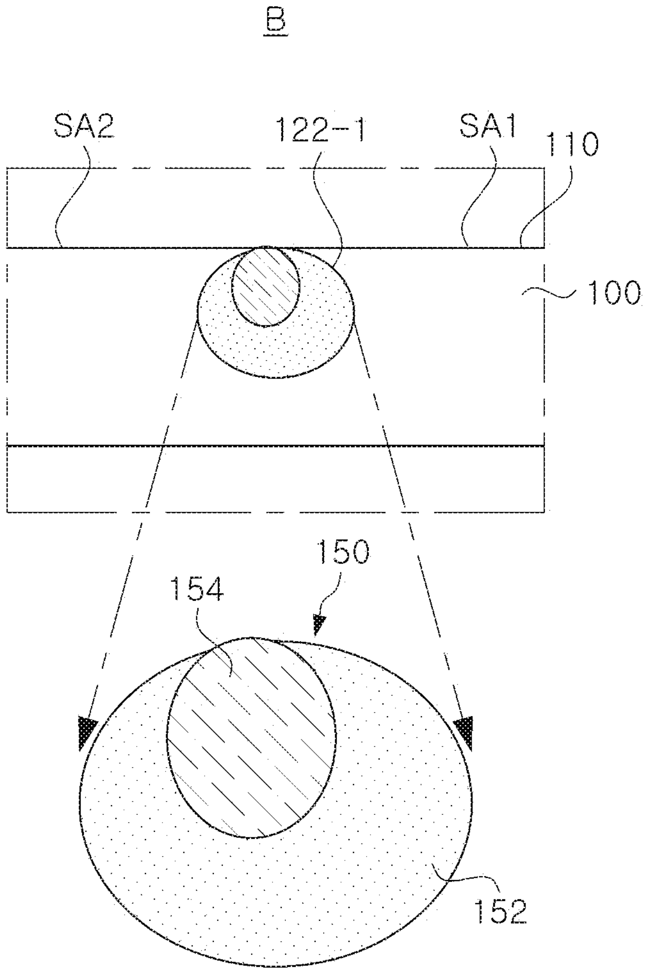
FIG. 5 is an enlarged view of portion B in FIG. 3 and is a schematic diagram illustrating a scribe lane in some example embodiments.
Figure 6:
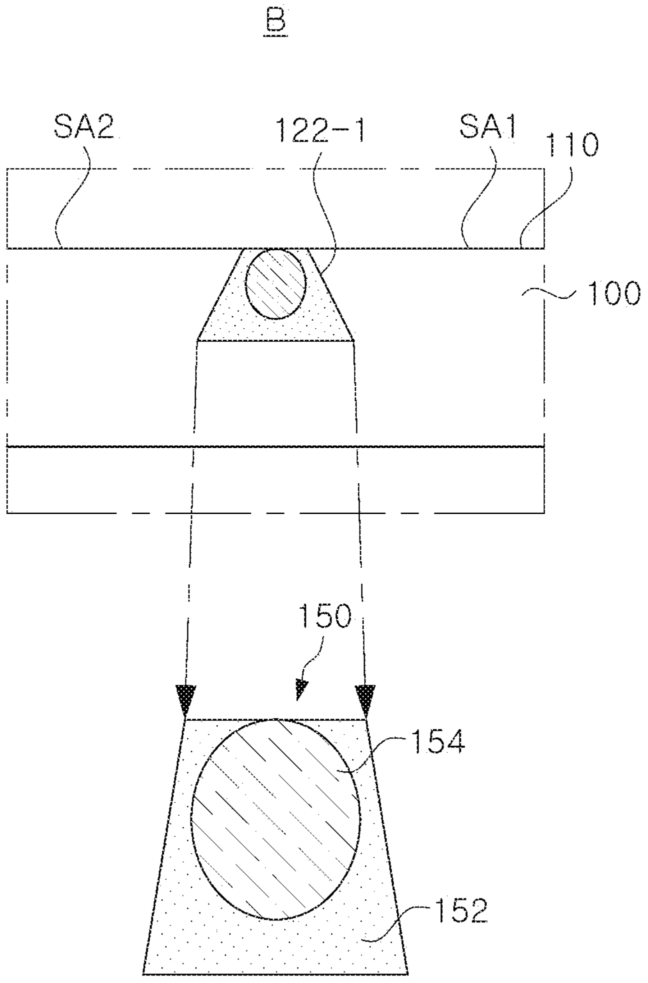
FIG. 6 is an enlarged view of portion B in FIG. 3 and is a schematic diagram illustrating a scribe lane in some example embodiments.

FIG. 4 is an enlarged view of portion B in FIG. 3 and is a schematic diagram illustrating the scribe lanes of some embodiments, FIG. 5 is an enlarged view of portion B in FIG. 3 and is a schematic diagram illustrating the scribe lanes of some embodiments, FIG. 6 Is an enlarged view of portion B in FIG. 3 and is a schematic diagram illustrating the scribe lanes of some embodiments.

Figure 7:
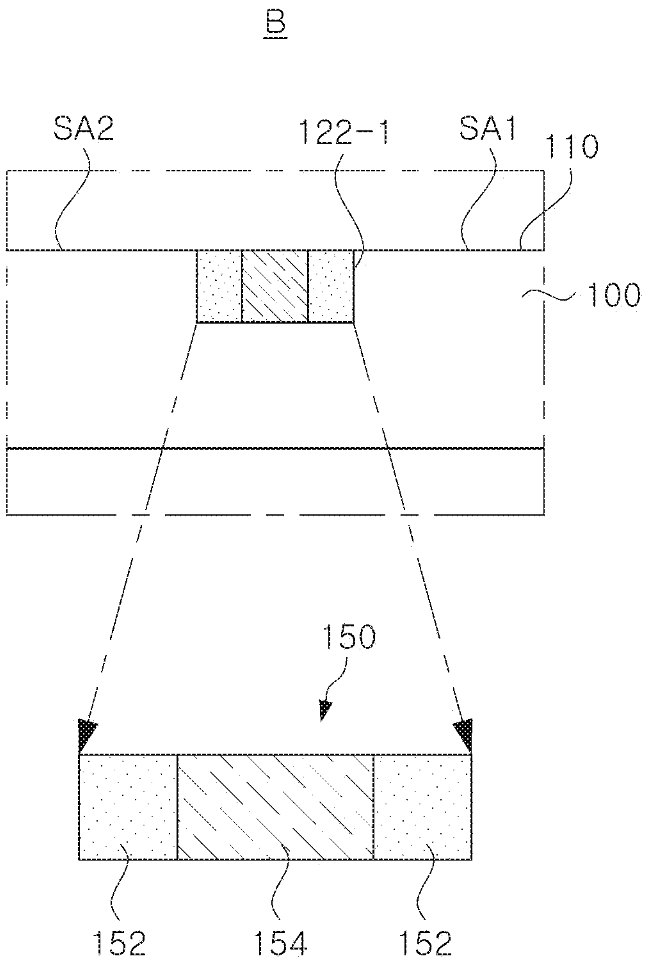
FIG. 7 is an enlarged view of portion B in FIG. 3 and is a schematic diagram illustrating a scribe lane in some example embodiments.

FIG. 7 is an enlarged view of portion B in FIG. 3 and is a schematic diagram illustrating a scribe lane in some embodiments.

Referring to FIGS. 4 to 6, various shapes of the scribe lane 120 and the laminated appearance of the first film 152 and the second film 154 stacked on the scribe lane 120 are disclosed.

The scribe lane 122-1 of the embodiment of FIG. 4 has a triangular groove shape or a quadrangular groove shape, and boundary surfaces of the first film 152 and the second film 154 laminated thereon form an oblique line. The first film 152 and the second film 154 are exposed side by side upwardly in the scribe lane 122-1. The first film 152 and the second film 154 may have different volumes in the scribe lane 122-1.

The scribe lane 122-1 of the embodiment of FIG. 5 has an elliptical groove shape, and the first film 152 laminated thereon is laminated to embrace the second film 154 therein. The scribe lane 122-1 of the embodiment of FIG. 6 has a trapezoidal groove shape, and the first film 152 laminated thereon is laminated to embrace the second film 154 therein.

In some example embodiments, e.g., as illustrated in FIGS. 5 and 6, the first film 152 and the second film 154 may be exposed upwardly from the scribe lane 122-1. Also, in the scribe lane 122-1, the first film 152 and the second film 154 may have different volumes. In some example embodiments, e.g., as illustrated in FIGS. 5 and 6, the second film 154 is embedded in the first film 152, but example embodiments are not particularly limited thereto, and at least one of the first film 152 and the second film 154 may be embedded in the other.

In some example embodiments as illustrated, e.g., in FIG. 7, the scribe lane 122-1 is formed of a rectangular groove, and in the scribe lane 122-1 between the semiconductor chip forming region SA1 and the adjacent semiconductor chip forming region SA2, the first film 152, the second film 154, and the first film 152 are arranged in order adjacent to the semiconductor chip forming regions SA1 and SA2.

Semiconductor Chip Manufacturing Method

A semiconductor chip manufacturing method, for example, a semiconductor process, is performed, e.g., in a semiconductor processing apparatus having a vacuum chamber. The wafer 100 before a process according to the present inventive concept is transferred into a vacuum chamber and various processing processes are performed thereon.

The wafer 100 before a process in the vacuum chamber is subjected to various processes, such as one or more of chemical vapor deposition (CVD), plasma-enhanced chemical vapor deposition (PECVD), reactive ion etching (RIE), plasma-assisted ion implantation (PLAID), annealing, oxidation, and nitridation in a vacuum state. In the semiconductor process, chips are manufactured by repeating deposition, patterning, and etching in the semiconductor chip forming regions SA1, SA2, SA3, . . . and diced or singulated along the scribe lane 120, thereby completing the semiconductor chip manufacturing process.

Figure 8:
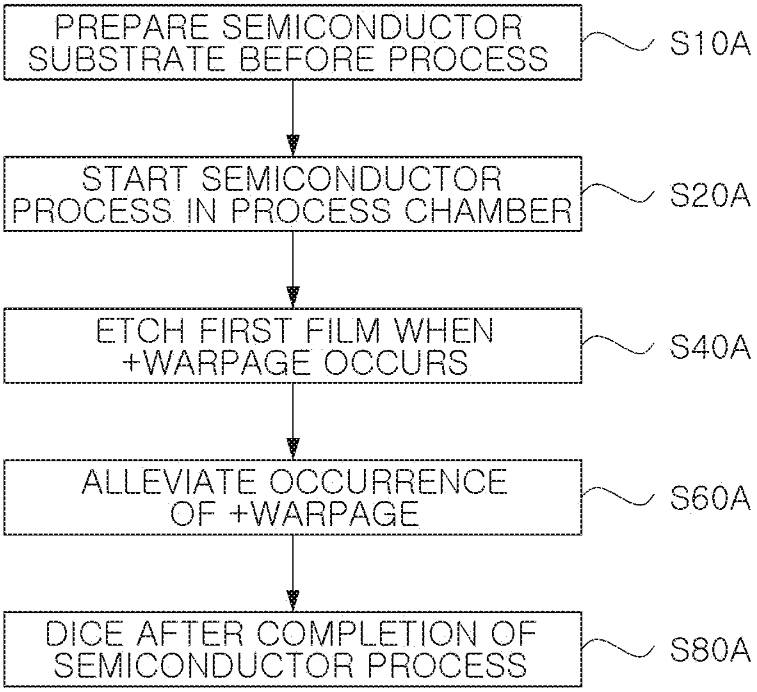
FIG. 8 is a flowchart of a semiconductor chip manufacturing process according to various example embodiments.
Figure 9:
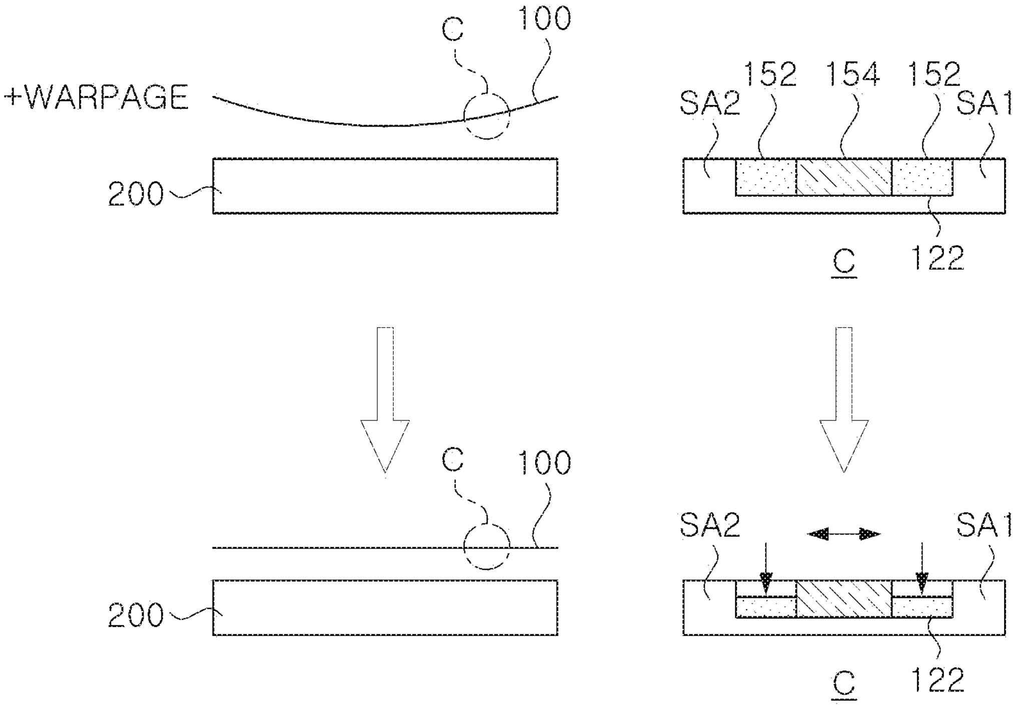
FIG. 9 is a schematic diagram illustrating a first film etching process (S40A) of FIG. 8.

FIG. 8 is a flowchart of a semiconductor chip manufacturing process according to various example embodiments, and FIG. 9 is a schematic diagram illustrating a first film etching process S40A of FIG. 8.

The semiconductor chip manufacturing process according to various example embodiments includes a process of alleviating or at least partly alleviating +warpage when +warpage occurs on the wafer 100 due to thermal deformation during the process, and the processing alleviating +warpage includes the following operations.

S10A: The wafer 100 before a process described above is prepared. The wafer 100 before the process includes the first film 152 and the second film 154 of at least different materials in the scribe lane 120 surrounding the semiconductor chip forming regions SA1, SA2, SA3, . . . Stress of the first film 152 and the second film 154 may be adjusted or at least partly adjusted during the process.

S20A: The wafer 100 before the semiconductor process is injected into a semiconductor process chamber, and a semiconductor process starts in the process chamber. A plurality of process chambers may be provided as needed or desired, and the wafer 100 may be transferred during the process.

S40A, S60A: When +warpage occurs on the wafer 100 above a susceptor 200 in the process chamber during the semiconductor process, the first film 152 may be etched or partially etched to generate tensile stress, which may thereby reduce the +warpage.

The first film 152 has a coefficient of thermal expansion higher than or greater than that of the wafer body 100 to generate compressive stress, and the second film 154 has a coefficient of thermal expansion lower than that of the wafer body 100 to generate tensile stress.

When the first film 152 is etched as +warpage occurs in the process chamber, the volume of the second film 154 generating tensile stress remains larger and the tensile stress increases. As a result, the occurrence of +warpage is alleviated or at least partly alleviated.

S80A: When the semiconductor process is completed, dicing may be performed to manufacture a semiconductor chip. The process of reducing warpage may improve the quality and/or the yield of semiconductor chips.

Figure 10:
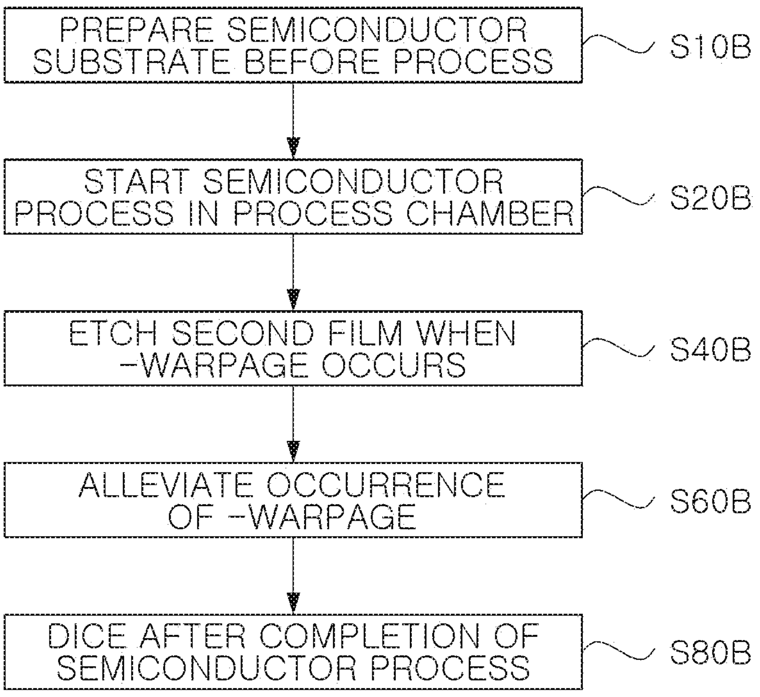
FIG. 10 is a flowchart of a semiconductor chip manufacturing process according to various example embodiments.
Figure 11:
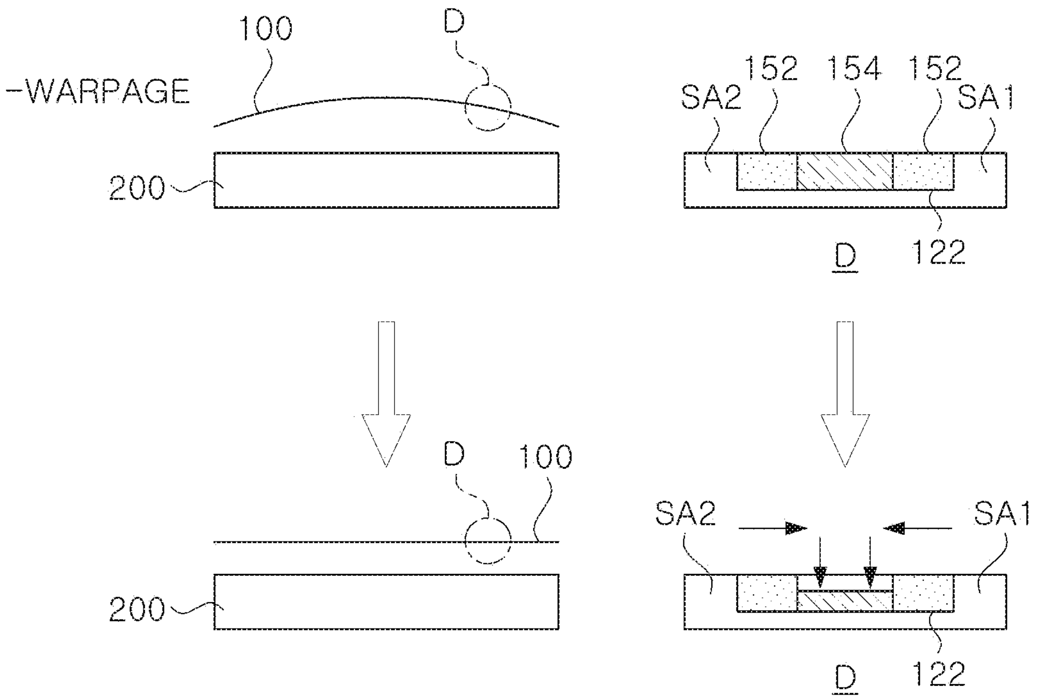
FIG. 11 is a schematic diagram illustrating a second film etching process (S40B) of FIG. 10.

FIG. 10 is a flowchart of a semiconductor chip manufacturing process according to various example embodiments, and FIG. 11 is a schematic diagram illustrating a second film etching process S40B of FIG. 10.

The semiconductor chip manufacturing process according to various example embodiments includes a process of alleviating or at least partially alleviating −warpage when −warpage occurs in the wafer 100 due to thermal deformation during the process, and the process of alleviating −warpage includes the following operations.

S10B: The wafer 100 before a process of the present inventive concept described above is prepared. The wafer 100 before a process of the present inventive concept includes at least the first film 152 and the second film 154 of at least different materials in the scribe lane 120 surrounding the semiconductor chip forming regions SA1, SA2, SA3, . . . Stress of the first film 152 and the second film 154 may be adjusted during the process.

S20B: The wafer 100 before a semiconductor process is injected into a semiconductor process chamber, and a semiconductor process starts in the process chamber. A plurality of process chambers may be prepared as needed or desired, and the wafer 100 may be transferred during the process.

S40B, S60B: When −warpage occurs on the wafer 100 above a susceptor 200 in the process chamber during the semiconductor process, the second film 154 may be etched to generate compressive stress, thereby reducing the −warpage.

The first film 152 has a coefficient of thermal expansion higher than that of the wafer body 100 to generate compressive stress, and the second film 154 has a coefficient of thermal expansion lower than that of the wafer body 100 to generate tensile stress.

When the second film 154 is etched as −warpage occurs in the process chamber, the volume of the first film 152 generating compressive stress remains larger and the compressive stress increases. As a result, the occurrence of −warpage is alleviated or at least partially alleviated.

S80B: When the semiconductor process is completed, dicing is performed to manufacture a semiconductor chip. The process of reducing warpage improves the quality and/or yield of semiconductor chips.

Various example embodiments illustrated in FIGS. 8 and 9 and FIGS. 10 and 11 may be integrated. In the complex and sophisticated semiconductor chip manufacturing, when +warpage occurs on the wafer 100 in the process chamber, the first film 152 is etched to alleviate or partially alleviate the +warpage and increase the flatness of the wafer 100. When −warpage occurs in another process, the second film 152 may be etched to alleviate or partially alleviate the −warpage and increase the flatness of the wafer 100.

During the semiconductor process, warpage may be maintained at 50 μm or less during the process by adjusting the volume of the stress adjustment portion, for example, the first film and the second film, and the flatness of the wafer may be improved to improve the quality and/or the yield of semiconductor device.

According to a wafer before a semiconductor process and the semiconductor chip manufacturing method using the same according to various example embodiments, the warpage may be maintained at 50 μm or less during the process by adjusting the volume of the stress adjustment portion, for example, the first film and the second film, and the flatness of the wafer may be improved, thereby improving the quality and/or the yield of semiconductor device.

While various example embodiments have been illustrated and described above, it will be apparent to those of ordinary skill in the art that modifications and variations could be made without departing from the scope of inventive concepts as defined by the appended claims. Furthermore, example embodiments are not necessarily mutually exclusive with one another. For example, some example embodiments may include one or more features described with reference to one or more figures, and may also include one or more features described with reference to one or more other figures.

What is claimed is:

1. A wafer comprising:
- a wafer body;
- a scribe lane surrounding a semiconductor chip region on one surface of the wafer body; and
- a stress adjustment portion in the scribe lane and recessed within the wafer body and including a first film and a second film that have at least different materials from that of the wafer body.

2. The wafer of claim 1, wherein the first film has a coefficient of thermal expansion greater than that of the wafer body.

3. The wafer of claim 2, wherein the first film includes polysilicon.

4. The wafer of claim 1, wherein the second film has a coefficient of thermal expansion less than that of the wafer body.

5. The wafer of claim 4, wherein the second film includes silica ($SiO_2$).

6. The wafer of claim 1, wherein a cross-section of the scribe lane is at least one of a quadrangular groove, a triangular groove, an elliptical groove, or a trapezoidal groove.

7. The wafer of claim 1, wherein the first film and the second film are exposed side by side upwardly in the scribe lane.

8. The wafer of claim 1, wherein the first film and the second film have different volumes in the scribe lane.

9. The wafer of claim 1, wherein
- one of the first film and the second film is embedded in another of the first film and the second film.

10. The wafer of claim 1, wherein
- adjacent to the semiconductor chip region in the scribe lane between the semiconductor chip region and an adjacent semiconductor chip region, a first one of the first film, the second film, and a second one of the first film are arranged.

11. A wafer comprising:
- a wafer body, the wafer body having a notch at one end thereof, wherein the wafer has a horizontal direction and a vertical direction based on the notch;
- a scribe lane recessed within the water body to surround a semiconductor chip region in the horizontal direction and the vertical direction on one surface of the wafer body; and a stress adjustment portion in the scribe lane and including a first film and a second film that have at least different materials from that of the wafer body.

12. The wafer of claim 11, wherein the first film has a coefficient of thermal expansion greater than that of the wafer body.

13. The wafer of claim 12, wherein the first film includes polysilicon.

14. The wafer of claim 11, wherein the second film has a coefficient of thermal expansion less than that of the wafer body.

15. The wafer of claim 14, wherein the second film includes silica ($SiO_2$).

16. The wafer of claim 11, wherein the scribe lane comprises a horizontal direction scribe lane and a vertical direction scribe lane, a cross-section of the scribe lane is at least one of a quadrangular groove, a triangular groove, an elliptical groove, or a trapezoidal groove.

17. The wafer of claim 11, wherein the first film and the second film are exposed side by side upwardly in the scribe lane.

18. The wafer of claim 11, wherein the first film and the second film have different volumes in the scribe lane.

19. The wafer of claim 11, wherein one of the first film and the second film is embedded in another of the first film and the second film.

20. The wafer of claim 11, wherein adjacent to the semiconductor chip region in the scribe lane between the semiconductor chip region and an adjacent semiconductor chip region, a first one of the first film, the second film, and a second one of the first film are arranged.

* * * * *